United States Patent [19]

Kessler

[11] 4,287,602

[45] Sep. 1, 1981

[54] REJECTION FILTER TO REMOVE TV CHANNEL 6 AND FM RADIO INTERFERENCE

[75] Inventor: William J. Kessler, Gainesville, Fla.

[73] Assignee: Corporation for Public Broadcasting, Washington, D.C.

[21] Appl. No.: 513,087

[22] Filed: Oct. 8, 1974

Related U.S. Application Data

[63] Continuation of Ser. No. 310,110, Nov. 28, 1972, abandoned.

[51] Int. Cl.³ .............................................. H03H 5/00
[52] U.S. Cl. .................................. 455/286; 455/307; 333/176; 333/178
[58] Field of Search ............... 325/365, 376, 378, 379, 325/380, 383, 388, 429; 343/180, 701, 722, 749, 750; 333/70 R, 76, 167, 175, 176, 177, 178; 455/269, 280, 286, 307

[56] References Cited

U.S. PATENT DOCUMENTS

| | | | |
|---|---|---|---|
| 1,869,870 | 8/1932 | Stevenson | 333/76 X |
| 2,258,974 | 10/1941 | Dagnall | 343/180 |
| 2,636,085 | 4/1953 | Boothby et al. | 333/76 X |
| 2,708,238 | 5/1955 | Silverman | 325/379 X |
| 2,815,441 | 12/1957 | Silverman | 333/76 X |
| 3,560,894 | 2/1971 | Fettweis | 333/76 |
| 3,733,608 | 5/1973 | McGhay et al. | 333/76 X |

OTHER PUBLICATIONS

Television Engineering Handbook–Fink McGraw-Hill, 1957.

*Primary Examiner*—Benedict V. Safourek
*Attorney, Agent, or Firm*—Staas & Halsey

[57] ABSTRACT

A two terminal electronic filter network is provided for connection across TV antenna input terminals to reduce interference from noncommercial FM radio stations operating within a frequency band near the TV channel 6 frequency band. The two terminal electronic filter circuit which exhibits a rapid change of reactance for changes in frequency, and having a resonant frequency provides sufficient FM signal rejection without significant attenuation of any VHF channel by the provision of a highly reactive network tuned below the resonant frequency of the filter network as a whole.

5 Claims, 8 Drawing Figures

REJECTION FILTER TO REMOVE TV CHANNEL 6 AND FM RADIO INTERFERENCE

This is a continuation of application Ser. No. 310,110 filed Nov. 28, 1972 and now abandoned.

BACKGROUND OF THE INVENTION

This invention relates to a method and apparatus for eliminating television interference and more particularly to a two terminal electronic filter useful in minimizing TV interference from adjacent noncommercial FM radio stations.

Due to present limitations now placed on the allocation of frequencies for commercial and noncommercial broadcasting stations, there arise many difficulties in the physical location of educational FM stations and television stations. One of the primary difficulties is the interference caused by educational broadcast stations operating at the low end of the noncommercial FM broadcast band, and which therefore lies immediately adjacent the upper end of the television channel 6 television band. Actual or potential interference to the color subcarrier within the channel 6 band imposes, generally, a requirement for the physical separation of the respective broadcast stations, and hence prevents the full development of public radio and specifically the utilization of educational FM radio broadcasting in areas served by television channel 6 stations. The problem arises due to the inadequate selectivity of present home television receivers—improved receiver selectivity is a long-range solution, if adopted and enforced, and hence offers no immediate or short-term solution. Co-location of the respective stations simplifies a solution to the problem, but frequently is neither feasible nor practical, or simply is not adopted. Expensive filters providing adequate rejection are available, but are not susceptible of wide-spread use; frequently, such filters as are adequate electronically must be installed by trained personnel, and again do not offer a solution to the problem which is either practical or feasible. Most presently available filters, on the other hand, either provide insufficient attenuation of the FM signal, or, conversely, if providing sufficient attenuation, have too broad an attenuation characteristic with the result that the insertion loss over the frequency range encompassed by TV channel 6 is unacceptable. There is thus a substantial need for low cost, immediately available apparatus by which such interference may be reduced so as to permit the licensing of educational broadcasting stations physically adjacent the television channel 6 stations.

Central to the elimination of this interference problem is the development of a low cost FM band rejection filter which can be easily installed across the 300 ohm input terminals of a standard television receiver, which filter is effective in reducing the level of FM interference to the reception of television channel 6, and can be installed by non-skilled persons, such as the typical owner/user of a TV receiver. In general, this filter must achieve at least a 20 dB rejection at the frequency of the interfering FM stations, e.g., a frequency (90 MHz.) within the noncommercial FM band (88.1-91.9 MHz.) with no more than a 3 dB insertion loss at the channel 6 color subcarrier frequency (86.85 MHz.). Moreover, there must be negligible insertion loss at all VHF TV channels 2 through 13.

Multiple pole-zero, four-terminal filter networks exist which, while providing a very high degree of rejection, have an associated attenuation characteristic far too broad with respect to the insertion loss over the frequency range encompassed by television channel 6. Additionally, it will be appreciated that a four-terminal device typically is expensive and is not readily adapted for installation or adjustment by the user of the television.

It is accordingly an object of this invention to provide a novel two terminal electronic filter network of simple configuration and low cost, which may be installed directly to the antenna terminals of the television receiver without requiring cutting of the television antenna lead-in.

It is another object of this invention to provide a novel low cost FM band rejection filter to reduce the level of FM interference from noncommercial FM stations to the reception of television channels.

It is yet another object of this invention to provide a novel, low cost two terminal electronic filter network for connection across the antenna input terminals of a television receiver to eliminate interference from signals in the noncommercial FM frequency band adjacent to the television channel 6 band, in which attenuation at network resonance is reduced to a predetermined minimum sufficient to achieve adequate rejection of interference from the FM frequency band, while lowering insertion loss at TV channel 6 and all other VHF channels also to acceptable levels.

It is a still further object of this invention to provide an electronic filter network for application across television receiver input terminals to provide at least 20 dB input signal rejection at the resonant frequency thereof while providing no more than a 3 dB insertion loss for the television channel 6 color subcarrier and a negligible insertion loss at the VHF television channels 2 through 13.

It is yet another object of this invention to provide a novel method of reducing interference from educational FM broadcasting to TV channel 6 and all other VHF television channels 2 through 13, while assuring acceptable levels of insertion loss at the frequencies of those TV channels, through use of the novel filter network of this invention.

These and many other objects and advantages of the present invention will become apparent to one skilled in the art to which the invention pertains from a perusal of the following detailed description when read in conjunction with the appended drawings.

THE DRAWINGS

DETAILED DESCRIPTION

Figure 1:
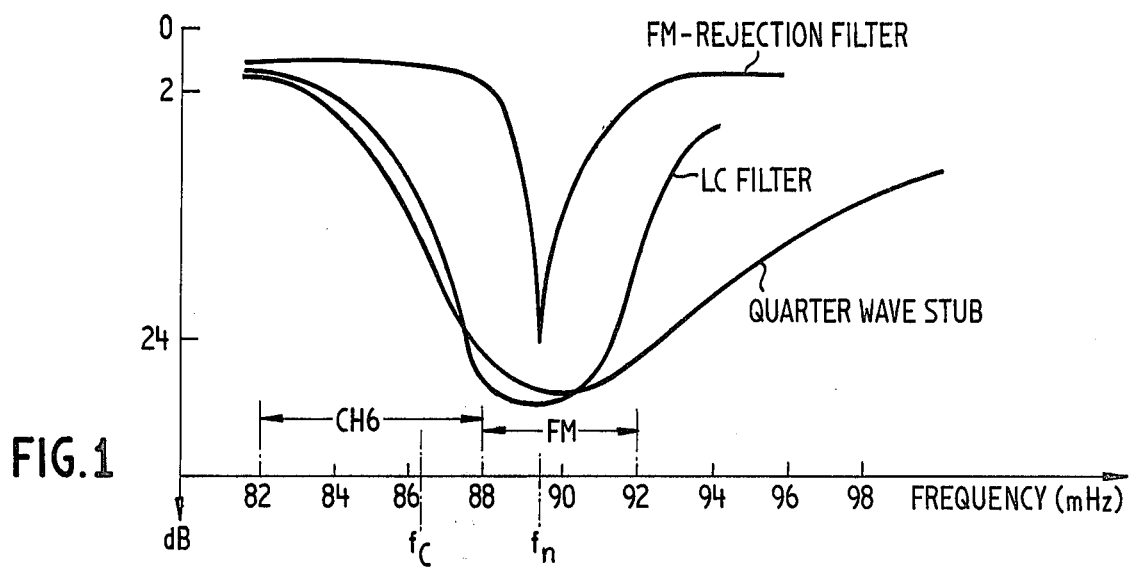
FIG. 1 is a graph illustrating the frequency separation of the noncommercial FM band and television channel 6 and indicating, relative to the rejection characteristic of a one-quarter wave stub and relative to a typical LC filter, a desirable rejection characteristic for eliminating noncommercial FM band interference with the color subcarrier of channel 6.

Referring now to FIG. 1, a graph of frequency versus attenuation is illustrated for the frequency bands including the television channel 6 and the noncommercial FM band. From the graph, it will be apparent that the noncommercial FM band (88.1–91.9 MHz.) lies immediately above the band allocated for channel 6 (82–88 MHz.). For practical purposes, there must be at least a 20 dB rejection at the frequency of the noncommercial FM station, e.g., (90 MHz.) to eliminate interference from that noncommercial FM station in frequency proximity to the channel 6 frequency while providing no more than a 3 dB insertion loss at the TV channel 6 color subcarrier frequency $f_c$ (86.85 MHz.). Ideally, it is desirable to design an electronic circuit such that the signal rejection characteristic of the signal applied to the television antenna terminals is as sharp as that of the FM rejection filter illustrated in FIG. 1.

One inexpensive method of rejecting an interfering signal is to connect an open quarter-wave stub across the antenna terminals of the television receiver. As shown in the graph of FIG. 1, the open quarter-wave stub configuration can produce substantial attenuation, e.g., 25 dB attenuation or more, at the resonant frequency thereof. However, as is illustrated, the rejection characteristic is far too broad and, while more than sufficient to reduce interference on channel 6 from noncommercial FM stations, introduces undesirable attenuation (insertion loss) of the TV channel 6 signal. Quarter-wave stubs, for use as interference filters, have been popular for a long time and are often thought to provide very sharp frequency discriminating characteristics. However, such stubs as filters are practical only when a substantial frequency interval exists between the frequency of the signal to be rejected and that of the signal of interest, and hence are not useful for the present problem. For instance, it can be seen in FIG. 1 that there is a significant attenuation, much in excess of 3 dB, at the channel 6 color subcarrier frequency $f_c$.

Sophisticated four-terminal constant impedance filter networks typically are unduly complicated both in structure and installation and are in general too expensive for the application here envisioned and hence do not offer a solution to the present problem.

Another approach to solving the present problem is the use of a series connected LC filter, connected across the antenna input terminals to a television receiver and tuned to resonate at the frequency of the interfering signal. The rejection characteristic for such an LC filter is also illustrated in FIG. 1. While sufficient attenuation of an interfering signal may be obtained in this manner, attenuation at VHF channel frequencies is excessive, precluding the use of such a filter for this purpose.

Under matched conditions, i.e., where $Z(R)=Z(A)$, $Z(R)$ being the input impedance of the television receiver and $Z(A)$ being the source impedance of the television antenna, "effective" attenuation, $\alpha$, of a conventional, series LC filter having impedance $Z(F)$ may be expressed as:

$$\alpha = -20 \log \left[ \frac{\frac{Z(R)}{2} + Z(F)}{Z(F)} \right] \quad (1)$$

The effectiveness of an LC filter network for a fixed receiver input impedance value (e.g., 300Ω) is thus determined exclusively by the rate of change of the impedance of the filter $Z(F)$ with respect to frequency, and this rate of change is insufficient to decrease the excessive attenuation of the conventional LC filter at desired passband frequencies. Thus, while it is possible with an LC series network to achieve a greater than 20 dB rejection at the resonant frequency, the attenuation at channel 6 frequencies is excessive because the rate of change of reactance for either the physical inductor or capacitor is not sufficiently great to give the network as a whole a sharp rejection characteristic. The attenuation may also be and typically is excessive at the further removed frequencies of channel 2 and channel 7.

A practical limit to increasing the L/C ratio of such filters results from the increased resistance of the inductance which reduces the Q of the circuit. An additional limitation is imposed by the requirement for impractically small values of capacitance to maintain the notch at the desired rejection frequency, e.g., 90 MHz.

Figure 2:
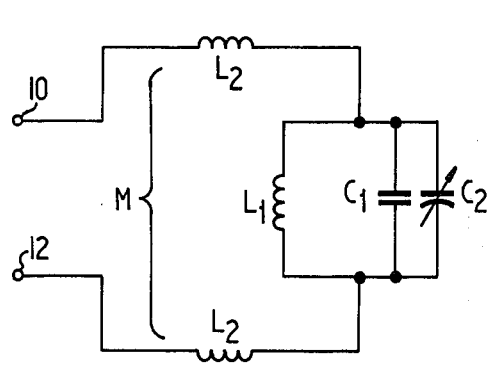
FIG. 2 is a schematic circuit diagram of the electronic filter network of the present invention.

With reference to FIG. 2, where one embodiment of the two terminal filter network of the present invention is illustrated, the filter includes mutually coupled inductors $L_2$ connected between the antenna terminals 10 and 12 of a conventional television receiver. The inductors $L_2$ are connected in series with a parallel LC circuit including an inductor $L_1$, a fixed capacitor $C_1$ and a variable capacitor $C_2$ all in separate branches. The use of the fixed capacitor $C_1$ in combination with the variable capacitor $C_2$ provides for a smooth, noncritical adjustment of the notch frequency.

Exemplary values of the various components of the circuit of FIG. 2 are listed in the following Table 1:

TABLE 1

| | | |
|---|---|---|
| $L_1$ | = | 0.1 μh |
| $L_2$ | = | 0.25 μh |
| $C_1$ | = | 24 μμfd |
| $C_2$ | = | 2–10 μμfd |

With continued reference to FIG. 2, the reactive elements $C_1$, $C_2$ and $L_1$ form a parallel high-Q resonant circuit at a frequency $f_p$ below the resonant frequency $f_n$ of the network as a whole. The resonant frequency of the network as a whole will hereinafter be referred to as the notch frequency, or rejection frequency.

In the circuit of FIG. 2, the reactive elements of Table 1 provide a parallel resonance frequency ($f_p$) at about 70 MHz. and a notch frequency ($f_n$) of about 90 MHz. By this difference in resonant frequencies between $f_p$ for the parallel circuit of $L_1$, $C_1$, $C_2$ and $f_n$ for the network of the two inductors $L_2$ and the equivalent series resonant circuit of $L_1$, $C_1$, $C_2$, a suitable compromise between notch depth and skirt steepness is obtained. For example, a rejection characteristic of less than 3 dB attenuation in the channel 6 band and greater than 20 dB attenuation at the notch frequency has been obtained.

At any frequency above $f_p$, the parallel circuit becomes an equivalent capacitance where the capacitance value itself varies with frequency, and in fact exhibits an extraordinarily rapid change of capacitive reactance with respect to a change in frequency as compared to the change in capacitive reactance of a single physical capacitor. Conversely, the parallel circuit becomes an equivalent inductance for frequencies below $f_p$, likewise exhibiting an extraordinarily great change of inductive reactance for changes in frequency, as compared to a single physical inductor.

This "equivalent capacitance" for frequencies above $f_p$ forms a series LC resonant circuit with the physical inductors $L_2$, producing a low impedance at the desired notch frequency. The network of FIG. 2 thus provides a very rapid change of impedance with frequency in the immediate vicinity of—i.e., going both above and below—the notch frequency. This rapid, frequency responsive impedance change produces a very sharp selectivity characteristic of the network. Since the effective capacitance provided by the parallel resonant circuit also exhibits a series resistance, the net Q of the network at resonance is reduced, and the maximum attenuation at the resonant frequency of the network as a whole is somewhat reduced. This maximum attenuation will be hereinafter referred to as notch attenuation for convenience. As will be apparent, the use of the equivalent series reactance of the parallel network, to form a series resonant circuit provides a means for optimizing the relationship of notch attenuation, or notch depth, to selectivity which in FIG. 1 may be visualized as the depth of the notch versus the steepness of the skirts of the response curve to provide an unusually sharp rejection characteristic with a simple low cost circuit.

The mutually coupled inductors $L_2$ provide an actual inductive reactance connected in series to the equivalent series reactance provided by the parallel resonant circuit comprising the inductor $L_1$, the capacitor $C_1$ and the capacitor $C_2$. The inductors $L_2$ are equal to provide electrical and mechanical symmetry since the electronic filter network is designed to be installed at the television receiver input terminals across a balanced 300 ohm line. To eliminate mutual coupling between the inductors $L_1$ and $L_2$ the filter may be constructed so that the axes of the inductors are mutually perpendicular. However, the mutual coupling of the two inductors $L_2$ is desirable, since it serves to increase the net inductance and hence the reactance of the network without substantially increasing the coil resistance; conversely, increasing the inductance by simply increasing the size of the physical inductors $L_2$ is detrimental, since the concomitant increase in coil resistance results in decreasing the Q of the circuit. The values for the inductors $L_2$ are selected to place the resonant frequency of the combined network at the desired notch frequency with the trimmer capacitor $C_2$ set in the center of the adjustment range.

In operation, the filter network of FIG. 2 is connected across the input terminals 12 and 14 of the television receiver and the capacitor $C_2$ set for maximum capacitance. If the capacitor $C_2$ is a typical trimmer capacitor, this setting may be accomplished by turning the tuning screw thereof all the way in. Under these circumstances the notch frequency should be between 83 MHz. and 85 MHz. The tuning screw may then be slowly turned to raise the notch frequency until it coincides with the interfering FM frequency, thereby to remove the interference with the channel 6 video reception caused by that FM frequency, as readily observed by monitoring the video display for channel 6 on the television screen; another monitoring technique is to detect the slight change in the sound signal which occurs as the notch frequency crosses 86.85 MHz.

Thus, the tuning screw of the capacitor $C_2$ may be rotated in the same direction, since initially set to one extreme for maximum capacitance, until a decrease is noted in the educational FM station interference on the screen of a television receiver tuned to channel 6. A noninductive, nonconductive tool should be utilized to turn the tuning screw of the capacitor $C_2$.

Figure 4:
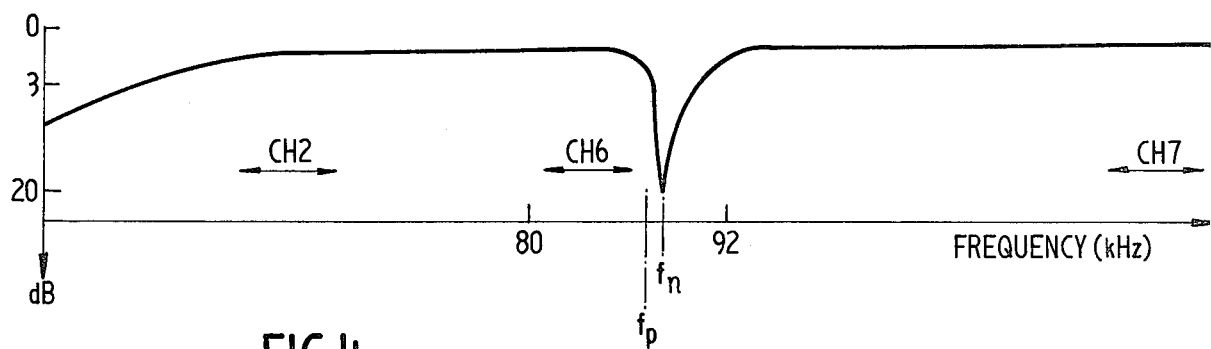
FIG. 4 is a graph illustrating the rejection characteristic of the filter network of FIG. 3.

As earlier mentioned, a problem with conventional LC filters is that the rate of change of the reactance thereof with respect to changes in frequency is not sufficiently great and thus unacceptable insertion losses at frequencies distant from the resonant frequency occur. A greater rate of change of reactance with respect to frequency is achieved by the invention, through the provision of a parallel LC circuit which functions as a highly reactive, equivalent series reactance circuit. As noted, the parallel connected LC circuit is tuned to a frequency $f_p$ below the notch frequency $f_n$, as seen in FIG. 4; as will be discussed later, $f_p$ more generally may be viewed as slightly displaced from $f_n$, either above or below, in accordance with different embodiments of the invention, and depending upon the particular application of the filter network. The difference in frequency between the resonant frequency of the parallel LC circuit and the notch frequency of the filter network is extremely important in providing adequate interference rejection with minimum insertion loss at closely adjacent frequencies. FIG. 4 shows the $-3$ dB point at the color sub-carrier frequency $f_c(-3\ dB) = 86.85$ MHz adjacent, and slightly less than, the notch frequency $f_n$ ($\approx 90$ MHz).

Figure 3:
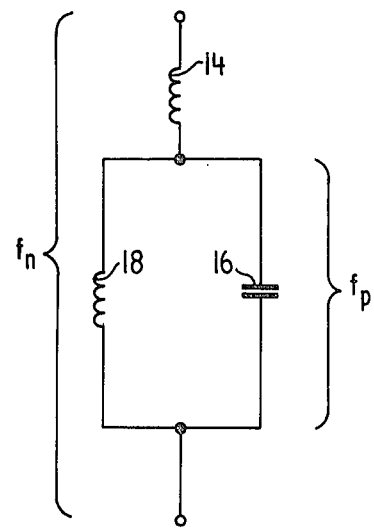
FIG. 3 is a schematic circuit diagram of the equivalent circuit of the electronic filter network of FIG. 2.

Referring to FIG. 3, the equivalent circuit of FIG. 2 is schematically illustrated in which the inductors $L_2$ of FIG. 2 are represented as a single inductor 14, the capacitors $C_1$ and $C_2$ are represented as a single capacitor 16 and the inductor $L_1$ is represented as an inductor 18. The parallel LC circuit exhibits an equivalent series reactance having a higher rate of change of reactance with frequency than does a physical series LC circuit. Thus, by the substitution of an appropriately tuned parallel circuit for a physical reactance, the rate of change of reactance of the entire filter network is increased significantly at and adjacent to notch frequency.

In general, the frequency of the parallel LC circuit is tuned away from the notch frequency so that at and near this notch frequency the parallel LC circuit functions as a highly reactive capacitive or inductive element. The equivalent series reactance of the parallel circuit of FIG. 3 is inductive for signals having a frequency below the resonant frequency $f_p$ of the parallel LC circuit. At frequencies above the resonant frequency $f_p$ of the parallel circuit, the equivalent series reactance of the parallel circuit is capacitive.

If the resonant frequency $f_p$ of the parallel circuit is too close to the notch frequency, the equivalent resistance becomes so large that the notch depth is too shallow to be effective even though the selectivity of the circuit may be high. Conversely, if the parallel resonant frequency is too far from the notch frequency, the filter will behave as an ordinary two element LC series resonant circuit with no unusual selectivity characteristics. The selecting of the resonant frequency of the parallel circuit is thus a compromise between maximum notch depth and the selectivity of the filter.

In the network of FIG. 3, the parallel circuit is tuned below the notch frequency $f_n$ so that the low band attenuation as illustrated in FIG. 4 occurs at frequencies far removed from the notch frequency and below the channel 2 band. High band attenuation does not increase because the inductive reactance of the inductor 14 of FIG. 3 progressively increases with frequency to effectively isolate the equivalent capacitance provided by the parallel circuit. The equivalent capacitance of the parallel circuit decreases with frequency and would attenuate the high band VHF channels if not isolated by the high reactance of the inductor 14 in the channels 7–13 range. The gradually decreasing capacitive reactance of the filter with a decrease in frequency may cause substantial attenuation at lower frequencies but this occurs below the channel 2 band and hence may be very beneficial in eliminating low frequency interference.

It is, however, possible to provide the above-mentioned parallel circuit in series with a physical capacitor rather than the inductor 14 as shown in FIG. 3. In the embodiment illustrated in FIG. 5, a capacitor 20 is connected in series with a parallel circuit having a capacitor 22 in one leg thereof and an inductor 24 in the other leg thereof.

Figure 5:
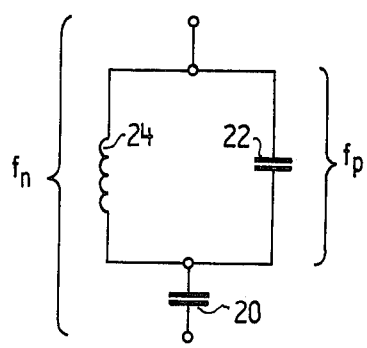
FIG. 5 is a schematic circuit diagram of the equivalent circuit of a second embodiment of the present invention.
Figure 6:
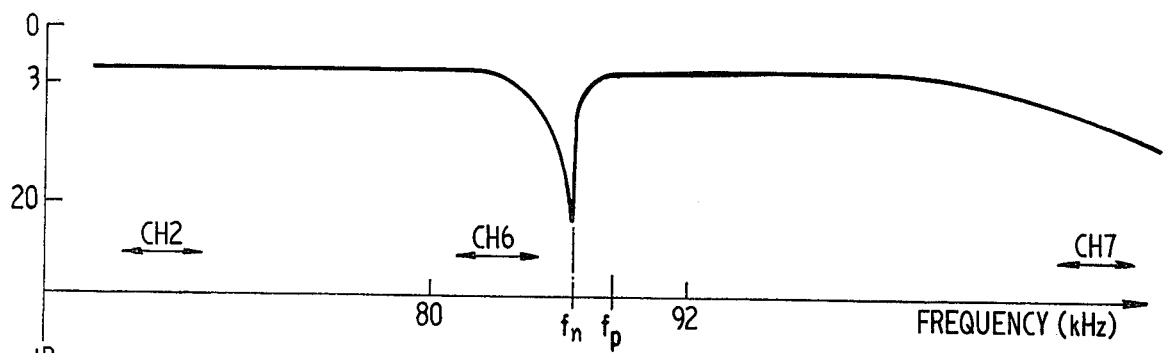
FIG. 6 is a graph illustrating the rejection characteristic of the filter network of FIG. 5.

In the network of FIG. 5, the parallel circuit operates as an equivalent series circuit inductive reactance at frequencies below $f_p$. The resonant frequency $f_p$ of the parallel circuit is therefore set above $f_n$. As illustrated in FIG. 6, the insertion loss is not material in the vicinity of the notch frequency, but the insertion loss is substantial at the high channel VHE band due to the gradually decreasing capacitive reactance of the filter. Therefore, whereas the tuning of the parallel circuit below the notch frequency and the connection thereof in series with a physical inductor as shown in FIGS. 3 and 4 is necessary for elimination of the channel 6 interference problem, the circuit of FIG. 5 having the reverse, generally non-symmetrical characteristic of FIG. 6 (i.e., relative to FIG. 4) is useful where corresponding, reverse rejection insertion loss considerations exist. In this instance, the 3 dB attenuation point, or lower edge of the passband above $f_n$ now occurs adjacent to, and slightly above $f_n$, as shown at f(−3 dB) in FIG. 6.

Figure 7:
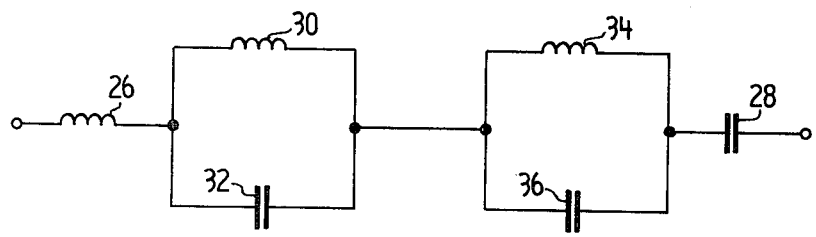
FIG. 7 is a schematic circuit diagram of the equivalent circuit of a third embodiment of the present invention.

Referring now to FIG. 7, there is shown a further embodiment of the invention, comprising a filter network embodying two parallel resonant circuits respectively providing an equivalent series capacitive reactance and an equivalent series inductive reactance to produce a still greater selectivity. This filter network further includes an inductor 26 and a capacitor 28 connected in series with the two parallel LC networks. The first parallel network includes an inductor 30 and a capacitor 32 having a resonant frequency $f_{p1}$ below the resonant frequency $f_n$ of the filter network as a whole, and the second parallel network includes an inductor 34 and a capacitor 36 having a resonant frequency $f_{p2}$ higher than the resonant frequency $f_n$ of the filter network as a whole. At the notch, or resonant frequency $f_n$, therefore, the equivalent series capacitive reactance of parallel circuit 30, 32 and the equivalent series inductive reactance of parallel circuit 34, 36 form effectively a series LC circuit resonant at $f_n$. The values of the inductance and capacitance of the elements 26 and 28 may be chosen to provide for series resonance at the notch frequency, e.g., 90 MHz.

The inductor 26 and the capacitor 28 may be visualized as avoiding undesirable attenuation at passband frequencies within the low band and the high band VHF channels i.e., frequencies displaced from the notch frequency. Thus, the use of the inductor 26 serves to reduce the insertion loss across the high band channel and the use of the capacitor 28 reduces the insertion loss across the low band channels. Thus, the physical reactances 26 and 28 may be eliminated if increased attenuation at frequencies substantially displaced from $f_n$ is of no concern. From an alternative viewpoint, the series LC network including physical elements 26 and 28 provides the basic rejection action while the two parallel circuits resonating, for example, at 85 and 95 MHz., respectively, serve to substantially "sharpen" the selectivity of the single LC circuit.

Figure 8:
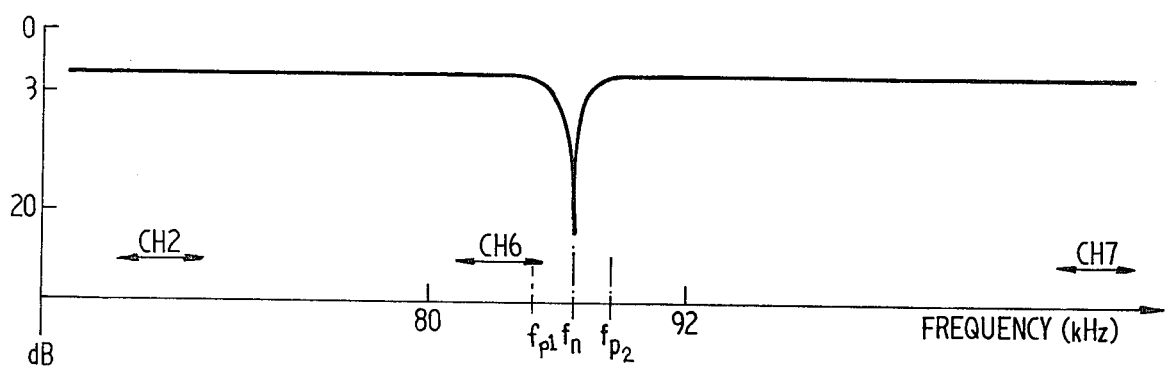
FIG. 8 is a graph illustrating the rejection characteristics of the filter network of FIG. 7; and, FIG. 9 is a circuit schematic illustrating the connection of the terminal network of the invention across the input terminals of a load device, such as a television receiver having connected to those same two terminals, outputs from a signal source, such as an antenna.

As illustrated in FIG. 8, the rejection characteristic of the circuit of FIG. 7 is symmetrical. As seen in FIG. 8, the 3 dB attenuation points $f_1$ (−3 dB), defining the upper edge of the lower pass band, and $f_2$ (−3 dB), defining the lower edge of the upper passband, are closely adjacent, above and below, respectively, the notch frequency, $f_n$. Retention of the physical inductor 26 and the capacitor 28 decreases attenuation of the extreme of the passband as is apparent from a comparison of the graphs of FIGS. 4, 6, and 8.

The inherent resistance of the inductors herein described has not been illustrated in the drawings. It is, however, to be understood that the resistive losses increase with the steepness of the notch.

Figure 9:
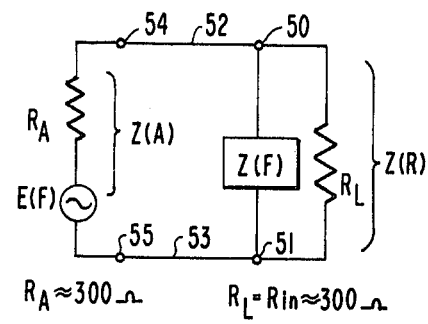

FIG. 9 is a circuit diagram showing the network of the invention in block diagram form and represented as Z(f) connected in shunt across terminals 50 and 51 of a television receiver represented by a load $R_L$ constituting the input impedance Z(R) of a television receiver and wherein that impedance represents the the input resistance $R_{in}$ of about 300 ohms as is conventional in practice and pointed out above. The antenna input terminals 50 and 51 are joined by leads 52 and 53, respectively, to terminals 54 and 55 of a signal source represented by a television antenna having the output impedance Z(A) and represented by an internal impedance $R_A$ of approximately 300 ohms and presenting the signal source E(F). The signal source, of course, is frequency dependent as designated by (F) and in accordance with the present invention, the notch network as well is frequency dependent as represented by the (F) in the designation Z(F). The notch circuit Z(F) may take any of the forms of the frequency dependent network of the invention as discussed above.

ADVANTAGES AND SCOPE OF THE INVENTION

From the foregoing, it will be appreciated that it is possible to fabricate a low cost, two terminal, three element electronic filter network, as seen in FIG. 3 (compare the networks of FIG. 2 employing capacitors $C_1$ and $C_2$ and the two coupled inductors $L_2$ in lieu of the single capacitor 16 and single inductor 14, respectively, of FIG. 3). The electronic filter network is, moreover, very compact and easily adjustable and may be connected to the antenna input terminals of a standard television receiver so that the television antenna lead-in cable need not be severed or even removed. The electronic filter network of the present invention is easily installed by unskilled personnel and has no critical components which may subsequently need the attention of a trained technician. The electronic filter network of the present invention, when connected across the antenna input terminals of a standard television receiver, provides both sufficient attenuation of the frequencies of the FM band while at the same time having sufficiently low passband attenuation so that channels 2 through 13 are virtually unaffected. In this manner, the use of the filter permits the licensing of FM stations in the same physical location as a channel 6 television broadcast station and thus significantly increases the utilization of the frequency spectrum.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A two terminal notch filter network for connection in shunt across two signal input terminals of a signal utilization circuit having a predetermined load impedance and receiving a signal from two output terminals of a signal source having a predetermined source impedance, said network having a low impedance at a desired frequency $f_n$ comprising the series resonant frequency of the network and a rapid change of impedance to a relatively high impedance for frequency bands in the immediate vicinity of $f_n$ with respect to said source and load impedance, whereby said network exhibits a sharp frequency rejection characteristic of a desired, relatively high attenuation level at the desired frequency $f_n$, comprising the series resonant frequency of the network, and a desired, relatively low attenuation level for frequency bands adjacent to $f_n$, comprising:

a parallel LC circuit parallel resonant at a frequency $f_p$ displaced from the resonant frequency $f_n$ of the network and having an equivalent series circuit impedance, the reactance value of which is a function of frequency and is predominately inductive for frequencies below $f_p$ and predominately capacitive for frequencies above $f_p$, and which is resistive at a frequency equal to $f_p$, further reactance means connected in series with said parallel LC circuit between said two terminals of said filter network and having a reactance value selected with respect to the equivalent series reactance value of said parallel LC circuit to establish said series resonant frequency $f_n$ of said filter network, the displacement of said frequency $f_p$ relatively to the frequency $f_n$ being selected to provide optimum sharpness of the said change in impedance of the network while affording adequate attenuation at the desired frequency $f_n$, said further reactance means comprising first and second inductors connected in a series circuit of said first inductor, said parallel LC circuit, and said second inductor between said two terminals of said filter network, and said first and second inductors being mutually coupled.

2. A two terminal notch filter network for connection in shunt across two signal input terminals of a signal utilization circuit having a predetermined load impedance and receiving a signal from two output terminals of a signal source having a predetermined source impedance, said network having a low impedance at a desired frequency $f_n$ comprising the series resonant frequency of the network and a rapid change of impedance to a relatively high impedance for frequency bands in the immediate vicinity of $f_n$ with respect to said source and load impedances, whereby said network exhibits a sharp frequency rejection characteristic of a desired attenuation level at the desired frequency $f_n$, comprising the series resonant frequency of the network, and a desired, relatively low attenuation level for frequency bands adjacent to $f_n$, comprising:

first and second parallel LC resonant circuits resonant at frequencies $f_{p1}$ and $f_{p2}$, respectively, displaced below and above, respectively, the resonant frequency $f_n$ of the filter network and each having an equivalent series circuit impedance, the reactance value of which is a function of frequency and is predominately inductive for frequencies below $f_n$ and predominately capacitive for frequencies above $f_n$, and which is resistive at the respective parallel resonant frequencies $f_{p1}$ and $f_{p2}$ thereof, said first and second parallel LC circuits being connected in series, and the predominately capacitive reactance of said first LC circuit at $f_n$ in conjunction with the predominately inductive reactance of said second LC circuit at $f_n$ establishing an effective series LC circuit resonant at $f_n$, the displacement of said frequencies $f_{p1}$ and $f_{p2}$ from $f_n$ being selected to afford a sharp notch characteristic of a desired high level of attenuation at $f_n$ and steeply rising skirts to a desired low level of attenuation in frequency bands immediately above and below said series resonant frequency $f_n$, and a further inductor and a further capacitor connected in a series circuit including said further inductor, said first and second parallel LC resonant circuits and said further capacitor between said terminals of said filter network.

3. A two terminal filter network as recited in claim 2 wherein the impedance values of said further inductor and said further capacitor are selected to define a series resonant frequency $f_n$ for a series circuit of said further inductor and said further capacitor.

4. A two terminal filter network as recited in claim 2 wherein for frequencies below $f_n$ and $f_{p1}$, said first and second parallel resonant characteristics are predominately inductive and the value of said further capacitor is selected to maintain a minimum level of attenuation of said filter network for the range of frequencies below $f_n$ and wherein for frequencies above $f_n$ and $f_{p1}$, said first and second parallel resonant characteristics are predominately capacitive and the value of said further inductor is selected to maintain a minimum level of attenuation of said filter network for the range of frequencies above $f_n$.

5. A two terminal filter network for connection in shunt across two signal input terminals of a television receiver circuit having a predetermined load impedance and receiving a signal from two output terminals of a signal source having a predetermined source impedance, said network having a low impedance at a desired frequency $f_n$ comprising the series resonant frequency of the network, centered in the educational FM frequency band and providing at least 20 dB attenuation of signals of the frequency $f_n$ and having a rapid change of impedance to a relatively high impedance for frequency bands in the immediate vicinity of $f_n$, with respect to said source and load impedances, whereby said network exhibits a sharply defined, narrow frequency rejection characteristic producing no more than a 3 dB insertion loss at the TV channel 6 subcarrier frequency and at all other VHF television channel signal frequencies, comprising:
- a parallel LC circuit resonant at a frequency $f_p$ displaced from the resonant frequency $f_n$ of the network and having an equivalent series circuit impedance, the reactance value of which is a function of frequency and is predominately inductive for frequencies below $f_p$ and predominately capacitive for frequencies above $f_p$, and which is resistive at a frequency equal to $f_p$,
- further reactance means connected in series with said parallel LC circuit between said two terminals of said filter network and having a reactance value selected with respect to the equivalent series reactance value of said parallel LC circuit to establish said series resonant frequency $f_n$ of said filter network, the displacement of said frequency $f_p$ relatively to the frequency $f_n$ being selected to provide optimum sharpness of the said change in impedance of the network while affording said at least 20 dB attenuation of the desired frequency $f_n$,
- said further reactance means comprising first and second inductors connected in a series circuit of said first inductor, said parallel LC circuit, and said second inductor between said two terminals of said filter network, and
- said first and second inductors being mutually coupled.

* * * * *

UNITED STATES PATENT AND TRADEMARK OFFICE
CERTIFICATE OF CORRECTION

PATENT NO. : 4,287,602

DATED : September 1, 1981

INVENTOR(S) : William J. Kessler

It is certified that error appears in the above—identified patent and that said Letters Patent is hereby corrected as shown below:

Front page, [57] Abstract, line 11, "highly reative network " s/b --reactive circuit which exhibits a rapid change of reactance for changes in frequency, and having a resonant frequency--.

"8 Drawing Figures" s/b --9 Drawing Figures--.

Column 4, line 7, "an LC" s/b --a conventional LC--.

Column 5, line 52, after "the" insert --effective--.

Column 6, line 20, after "circuit" insert --at and adjacent to the notch frequency--.

Column 8, line 20, "pass band" s/b --passband--;
line 36, delete the second occurrence of "the".

Column 10, lines 39 and 44, after "2" insert --,--.

Signed and Sealed this

Sixteenth Day of March 198.

[SEAL]

Attest:

GERALD J. MOSSINGHOFF

Attesting Officer    Commissioner of Patents and Trademarks